(12) United States Patent
Mansfield

(10) Patent No.: US 6,519,343 B1
(45) Date of Patent: Feb. 11, 2003

(54) ACTIVE CONTROL OF ACOUSTIC OUTPUT IN GRADIENT COILS

(76) Inventor: Peter Mansfield, 68 Beeston Fields Dr., Bramcote, Nottingham NG9 3DD (GB)

( * ) Notice: Subject to any disclaimer, the term of this patent is extended or adjusted under 35 U.S.C. 154(b) by 0 days.

(21) Appl. No.: 09/254,844

(22) PCT Filed: Sep. 26, 1997

(86) PCT No.: PCT/GB97/02635

§ 371 (c)(1),
(2), (4) Date: Mar. 8, 1999

(87) PCT Pub. No.: WO98/13821

PCT Pub. Date: Apr. 2, 1998

(30) Foreign Application Priority Data

Sep. 27, 1996 (GB) .............................................. 9620138

(51) Int. Cl.[7] .................................................. A61F 11/06
(52) U.S. Cl. ..................................................... 381/71.1
(58) Field of Search ................................ 381/71.1, 71.2, 381/71.7, 94.1

(56) References Cited

U.S. PATENT DOCUMENTS 5,548,653 A    8/1996    Pla

FOREIGN PATENT DOCUMENTS

| JP | 07 079952 | 3/1995 |
| JP | 08 038443 | 2/1996 |
| WO | WO 96 31785 | 10/1996 |

*Primary Examiner*—Minsun Oh Harvey
(74) *Attorney, Agent, or Firm*—Kilpatrick Stockton, LLP

(57) ABSTRACT

An acoustically controlled magnetic coil system is provided in which suitable non-magnetic transducers are embedded in a block of acoustic material in which the coil is also embedded, the transducers being energised to oppose the vibratory noise generated by the coil when energised.

16 Claims, 10 Drawing Sheets

ACTIVE CONTROL OF ACOUSTIC OUTPUT IN GRADIENT COILS

The present invention relates to a method and apparatus for active control of acoustic output in gradient coils and more particularly for reduction of the noise output of a coil system without significant interference with the magnetic field generated by the coil system.

As magnetic fields get higher in magnetic resonance imaging, (MRI) (P. Mansfield P. and P. G. Morris, NMR Imaging in Biomedicine. Academic Press, NY. (1982)), the gradient coils necessary in the imaging process become more obtrusive by virtue of the very high levels of acoustic noise generated. This arises because the very high currents in the wires required to produce the gradients generate very large Lorentz forces by interacting with the large static magnetic field present.

Various attempts have been made to ameliorate the acoustic noise is problem by damping, or by attempting to cancel the noise intensity in air. This approach is like treating the symptoms of the problem rather than going to the cause. More recently a new approach has been advocated which balances all Lorentz forces within the coil system (P. Mansfield, B. Chapman, P. Glover and R. Bowtell, International Patent Application, No. PCT/GB94/01187; Priority Data 9311321.5, Jun. 2, (1993), P. Mansfield, P. Glover and R. Bowtell, Active acoustic screening: design principles for quiet gradient coils in MRI. Meas. Sci. Technol. 5, 1021–1025 (1994) and P. Mansfield, B. L. W. Chapman, R. Bowtell, P. Glover, R. Coxon and P. R. Harvey, Active acoustic screening: Reduction of noise in gradient coils by Lorentz force balancing. Magn. Reson. Med. 33, 276–281 (1995)). In principle this should solve the problem completely. This would be the case if the supporting material coupling the force balancing wires had an infinitely high compressional wave velocity. Unfortunately, from this point of view, all materials are compressible and for most readily available plastic materials the sound wave velocity lies in the range 1–3 kms$^{-1}$. In practice this means that when frequencies increase and, of course, depending on the dimensions of the supporting material, the structure can approach a resonance condition. But even before this occurs it has been shown quite recently that distortions in the supporting material are responsible for the launch of sound waves in air (P. Mansfield, P. M. Glover and J. Beaumont, Sound Generation in Gradient Coil Structures for MRI. Magn. Reson. Med. (to be submitted)). For a flat plate it is shown that the sound waves in air produce an acoustic diffraction pattern. When Lorentz force balanced wires are coupled with any material the sound output depends on frequency and is generally large unless additional precautions are taken to absorb acoustic energy in the diffraction side lobes. This approach is, therefore, likely to be of limited value only. In a recent PCT application No. GB96/00734, a different approach has been advocated in which additional wire loops are added as an integral part of the coil structure in an attempt to cancel the acoustic wave generation within the solid structure. This approach exploits the Lorentz forces which are generated by the additional loop of wire. When the phase and amplitude of the Lorentz forces are adjusted correctly this approach appears to produce the desired acoustic noise cancellation. A slight disadvantage with this approach is that the additional wire loops will themselves produce undesirable magnetic fields at the gradient coil centre. For magnetically screened coils the additional wire loops can also produce undesirable extraneous magnetic fields which to some extent vitiate the magnetic screen.

In the new approach described in this invention the additional wire loops mentioned above are replaced by self-contained transducers which may be of the piezoelectric type or some other type and which produce no substantial extraneous magnetic fields.

Quiet gradient coils will be of value in a range of MRI applications where ear-plugs or ear-defenders for the subject are either undesirable or impractical. Such situations exist in foetal scanning in pregnancy, paediatric imaging of the very young and in veterinary applications. Wider applications exist with normal patient scanning where noise levels, even with ear-plugs, become intrusive and potentially dangerous. Quiet gradients could find a special application in studies of functional imaging of the brain. There is considerable interest in studying the acoustic cortices and their response to specially tailored phonic inputs. Such responses can be overwhelmed by the intrusive gradient noise input unless it can be significantly attenuated.

U.S. Pat. No. 5,548,653 discloses an active noise and vibration actuators which are mounted on support members on the surface of a coil structure and are activated to minimise the total noise eminating from the system.

The present invention provides apparatus for active acoustic screening of a coil system, said coil system comprising at least one current carrying conductor, the coil system being suitably mounted either between two blocks of acoustic material, the blocks being separated by a gap or within a slot in one block of acoustic material with a slot within the block, characterised in that an active electromechanical transducer is mounted in said gap or slot in order to balance the active and reactive forces produced by the transducer and including means for energising the electromechanical transducer to oppose the vibratory noise generated by said coil system when energised in a static magnetic field.

The present invention also provides an active acoustically controlled magnetic coil system comprising at least one current carrying conductor configured in a loop to provide outward and return paths characterised in that said outward and return paths are mounted in support blocks of material having predetermined acoustic transmission characteristics, said support blocks comprising first and second portions separated by a gap said outward and return paths being mounted respectively in said first and second portions and further including at least one active transducer mounted in said gap, and comprising means for supplying a predetermined alternating current to said conductor and energisation means for supplying the at least one active transducer with selected energisation and selected phase with respect to the said alternating current, said energisation being selected to generate mechanical movement in said transducer to actively oppose vibrations created in said support block by said conductor to reduce the acoustic noise generated by the coil system.

The present invention further provides an acoustically controlled magnetic coil system in which there are provided a plurality of transducers, each being provided with energisation to create mechanical movement within the transducer to reduce the noise generated by the coil system when energised in a static magnetic field.

Preferably the means for determining the selected energisation supplied to the transducers comprises a microphone mounted to receive noise signals generated by the at least one current carrying conductor, said microphone being connected to a display means and including a control circuit supplying relative phase and amplitude control signals to said energisation means to energise the transducers to reduce the noise generated by the coil system.

Preferably the active transducer comprises a piezoelectric transducer. The piezoelectric material may be a quartz crystal, barium titanate, lead zirconium titanate or other such piezoelectric materials.

Alternatively, the active transducers may comprise magneto strictive devices of a size small enough so as not to significantly affect the required gradient field. A further alternative is an active transducer comprising a thin current loop enclosing a rubber block, its dimensions chosen so as to make the device non-resonant at the operating frequency.

In a first embodiment, the first and second portions of the support block may comprise the same material and the position of the gap may be equidistant between the outward and return paths.

In a second embodiment the first and second portions of the support block may comprise different materials having different acoustic compressional wave velocities and different attenuation constants, the position of the gap may then be selected to be non-equidistant between the outward and return paths of said current carrying conductor.

In a third embodiment, the transducer may be provided with a matching unit to enable it to produce different mechanical movements on each side of the gap.

In a further embodiment the outward and return paths may comprise separate conductors with separate drive means forming a coil system comprising a primary coil and a magnetic screening coil for said coil system, the transducer means being energised to reduce the acoustic output of the coil system.

In a complex system for MRI the coil system may comprise x,y and z gradient coils and screening coils for said x,y and z gradient coils and the transducers may be mounted between said coils and said screening coils and energised to reduce the acoustic output of the system.

The transducers may require to be spatially distributed with common zones used to cancel the acoustic wave for the x,y and z gradient coils and a logic matrix drive system may be used to selectively energise a plurality of drive units for the transducers, those transducers within any common zone area being driven at an amplitude and phase which may be different to those in non-common zones.

Preferably the conductors for each primary coil and magnetic screening coil and the acoustic control transducers are each distributed on individual cylindrical geometries, each of the aforesaid coils being arranged in the form of a fingerprint coil each cylinder being arranged in a nested concentric and coaxial set.

When wires are pulsed with current, I, within a magnetic field, they experience a Lorentz force which depends on the magnetic field strength, B, and is maximised when the angle between the current and field directions is 90°. If the wire is embedded in a supporting block of material, its movement will launch an acoustic wave in the material. The basic idea for this invention is to cancel the acoustic waves which are launched by the gradient coil wires into the supporting structure. But this is done by injecting a suitably phased second acoustic wave of appropriate amplitude to cancel the first wave within the solid structure. In a previous design this is achieved by adding extra wires to the gradient coil design (P. Mansfield, Active Acoustic Control in Quiet Gradient Coil Design for MRI. PCT Application GB96/00734). In the present invention this is achieved by use of suitable non-magnetic transducers. These transducers could be piezoelectric transducers based on either quartz crystals, barium titanate or lead zirconium titanate or other such piezoelectric materials, or by the use of suitable magneto strictive devices which are small enough so as not to affect significantly the required gradient field or by small self-contained, localised current loops arranged so that the loop plane is orthogonal to the magnetic field B. In the following we shall use the word transducer to mean any one of the above mentioned devices or a device working on similar principles singly or in combination with any of the aforementioned devices.

Embodiments of the present invention will now be described by way of example with reference to the accompanying drawings in which FIG. 1 shows a diagram indicating an x gradient set made from four rectangular loops of N turns, all carrying current I;

FIG. 2 shows a plan view of a distributed x gradient coil made up of current loops (rectangular or arcuate). Each quadruplet of loops about the central x-y plane carries the same current. Successive quadruplets may have different currents if the space between the successive quadruplets is constant;

FIG. 3 shows a sketch showing the x gradient comprising four arcuate segments of closed arc loops, each comprising N turns and carrying the current;

FIG. 4 shows a sketch of a wire supporting board with a single current loop inset. The board is split with an air gap. Mechanical integrity is maintained by two connecting blocks, $BL_1$ and $BL_2$. Transducers are posted in the slot;

FIG. 5 shows a plan view of the arrangement shown in FIG. 4 with transducer glued in the slot or gap;

FIG. 6 is a block diagram of the transducer drive circuit arrangement showing the network analyser, its output via the phase splitter to the gradient power supply and the voltage power supply for the transducers. The test coil produces an acoustic output which is received by the microphone. The microphone signal is fed via the pre-amplifier back to the network analyser. Points PQ and P'P' are the coupling points in the circuit modification shown in FIG. 7;

FIG. 7 shows a block diagram for a modified insert circuit between points PQ and P'P' of FIG. 6. The purpose of this modification is to allow the circuit to be pulsed with trapezoidally shaped or other shaped waveforms and to introduce the necessary delay between the gradient waveform and the transducer waveform. To achieve this the switches, S1 and S2, are set to switch in the pulsed generators, PG1 and PG2, respectively. These generators are triggered by trigger pulses which are initiated from the trigger input, T, of FIG. 6 but are delayed with respect to each other by delays, D1 and D2;

FIG. 8 shows a sketch of one arcuate segment of a transverse gradient coil (see FIG. 3) which is mounted on a board in which a central slot is cut. Transducers with matching arrangements are mounted in the gap;

FIG. 9 shows a sketch of an acoustic matching arrangement and transducer mounted between the two surfaces. The matching arrangement comprises three rigid plates shown in end section (thick black lines), the middle plate being hinged or pivoted at both ends to the other two plates. Flexible filler material is shown shaded;

FIG. 10 shows a sketch showing the mounting of two arcuate segments of a gradient coil on a single plate. Transducers and matching arrangements are mounted within the central slot. Additional air gap slots are also shown;

Figure 14:
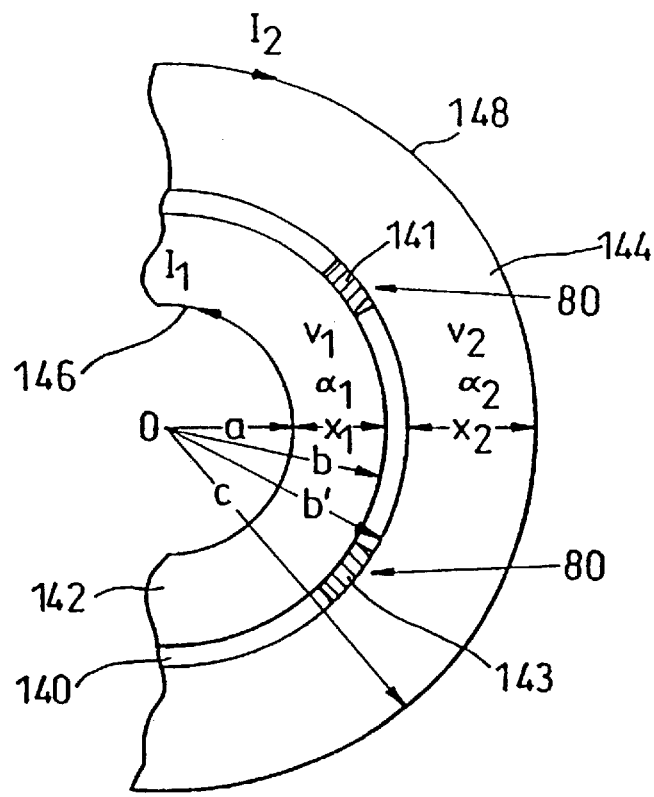
Figure 15:
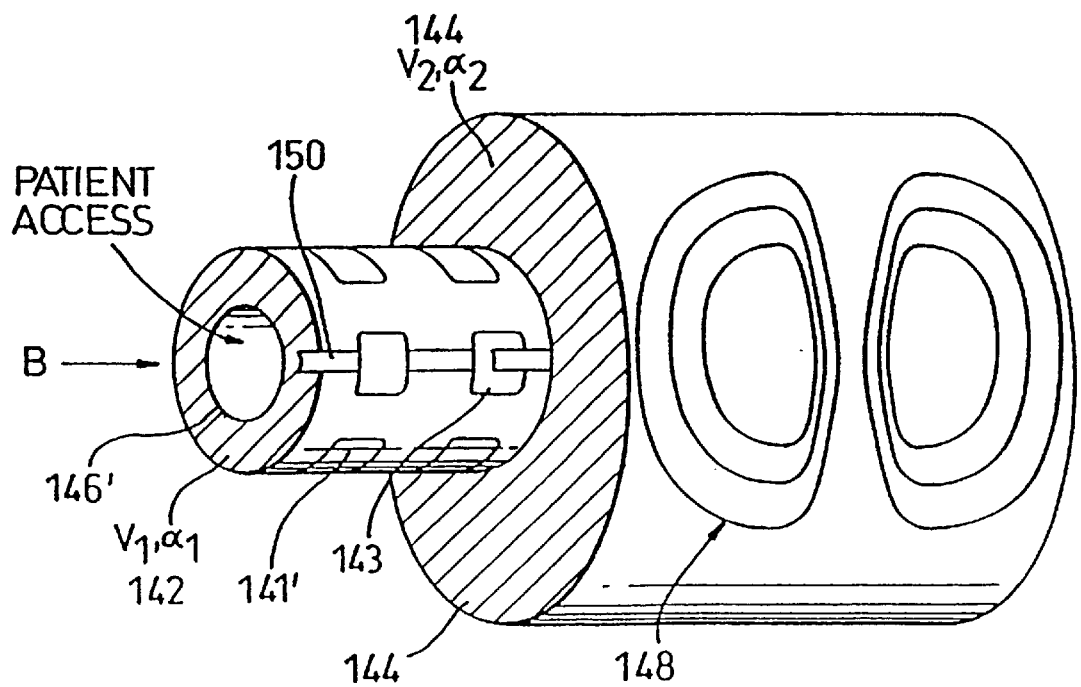

FIG. 14 shows a sketch showing an end-on view of two coaxial annular cylinders separated by a slot into which are mounted transducers and matching units, where necessary. The inner cylinder carries a primary coil at radius a. The outer cylinder carries a magnetic screen coil at radius c. The inner cylinder has a thickness $x_1$ with an acoustic wave propagation velocity $v_1$ and attenuation $\alpha_1$. The outer cylinder has a thickness $x_2$ an acoustic wave propagation velocity $v_2$ and attenuation $\alpha_2$. This arrangement represents a magnetically screened transverse gradient coil or a magnetically screened axial gradient coil;

FIG. 15 shows a sketch of an exploded view of a magnetically screened transverse gradient coil comprising two coaxial annular cylinders with dimensions and details as contained in FIG. 14. The transducers and matching, where necessary, are shown on the outer surface of the inner cylinder;

FIG. 16($a$) shows a sketch of a uniform distribution of transducers on an unrolled cylindrical surface. Only the positive half-plane is shown with axes +z and r$\theta$. The surface is divided into nine zones; Z1, Z2, Z12 and Z21 and their corresponding anti-phase zones $\overline{Z}$ plus Z3. All transducers and matching units are fixed to a thin flexible surface which carries the supply leads to the devices. If the −z half-plane is included, an additional nine zones are required all complementary to those described;

FIG. 16($b$) shows an end view of the transducer array sheet of FIG. 16$a$ when rolled into a cylindrical annulus. The outer surface of radius b' also consists of a thin flexible sheet of material which holds the matching units in place. The whole transducer assembly is inserted in the slot of FIG. 14;

FIG. 16($c$) shows a sketch of an alternative current transducer comprising a strip conductor sandwiching a stiff rubber spacer. The transducer is fed from a strip line as indicated and the plane of the enclosed current loop is normal to the magnetic field B; and FIG. 17 shows a circuit drive arrangement for the transducer assembly as shown in FIG. 16$a$ indicating the individual zone drive arrangements and common zones and logic drive shown schematically with truth table as in Table 1.

There are several geometries of gradient design which are currently in use and which could benefit from the application of this invention. Gradient coils can be magnetically screened or unscreened. The unscreened variety can be made up of a series of closed loops (P. Mansfield, B. Chapman, P. Glover and R. Bowtell, International Patent Application, No. PCT/GB94/01187; Priority Data 9311321.5, Jun. 2, (1993), P. Mansfield, P. Glover and R. Bowtell, Active acoustic screening: design principles for quiet gradient coils in MRI. Meas. Sci. Technol. 5, 1021–1025 (1994), P. Mansfield, B. L. W. Chapman, R. Bowtell, P. Glover, R. Coxon and P. R. Harvey, Active acoustic screening: Reduction of noise in gradient coils by Lorentz force balancing. Magn. Reson. Med. 33, 276–281 (1995) and V. Bangert and P. Mansfield, Magnetic field gradient coils for NMR imaging. J. Phy. E. Sci. Instrum., 15, 235–239 (1982)).

Figure 1:
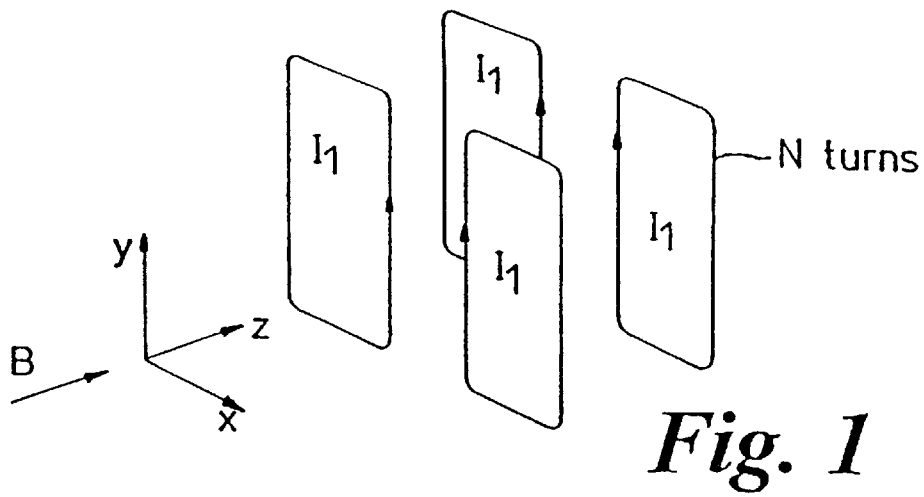
Figure 2:
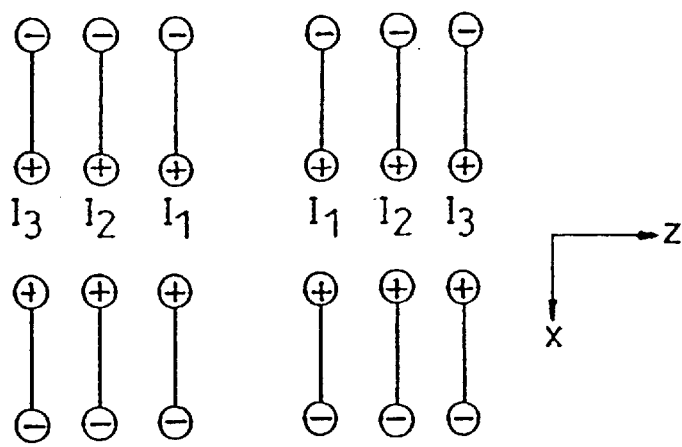

For rectangular symmetry transverse gradients can be generated from a series of rectangular closed loops suitably placed and distributed to give the best transverse gradient. FIG. 1 shows a transverse gradient coil with four loops, each with N turns. The whole coil arrangement lies in a magnetic field B which points along the z axis. FIG. 2 shows a plan view of a distributed arrangement of equally spaced loops carrying different currents $I_1, I_2 \ldots$. An alternative is to use a common current in all loops and vary the turns in each loop. A further alternative is to keep the turns and current constant and vary the spacing between loops. Mixtures of the two alternatives are also possible.

Figure 3:
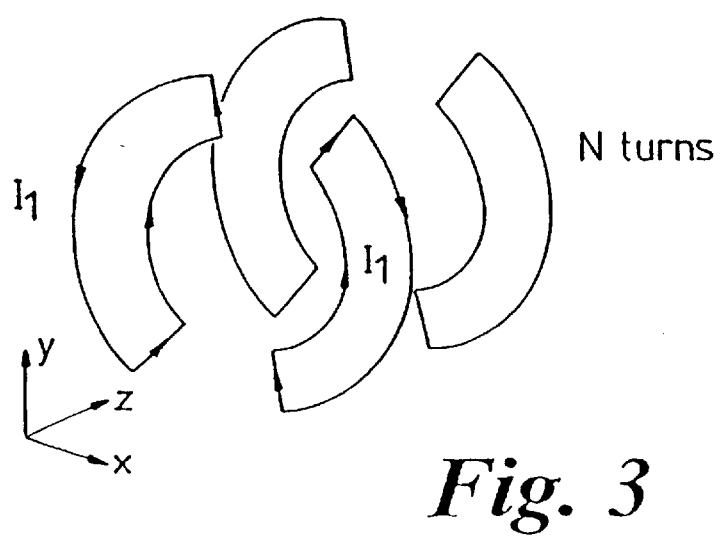

For transverse gradients with cylindrical symmetry a series of closed arc loop segments can be used. FIG. 3 shows a transverse cylindrical symmetry gradient coil with four segments. As in the case of the rectangular segments, more arcuate segments can be used to form a distributed coil arrangement as shown in plan view in FIG. 2. The same considerations of current, turns and spacing discussed for the rectangular segments apply equally for arcuate segments.

For an axial field gradient modifications of the Helmholtz coil can be used in which distributed coils are used to create a more uniform gradient field.

Coils comprising a series of closed loops possess intrinsic cancellation of the Lorentz forces extant around the loop when the plane of the loop is normal to the magnetic field direction. For simplicity we consider one of the rectangular closed loop coils from FIG. 1. This is redrawn together with its mounting board in FIG. 4.

Figure 4:
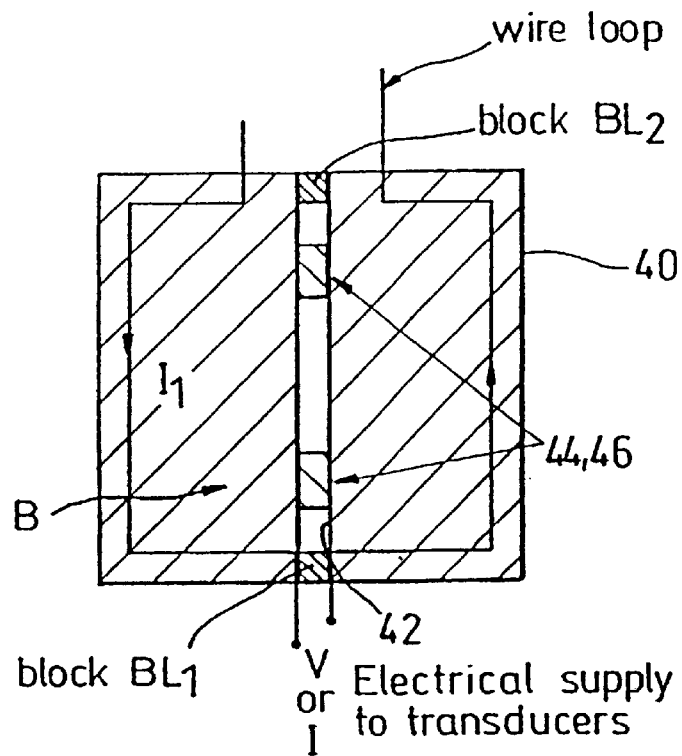
Figure 5:
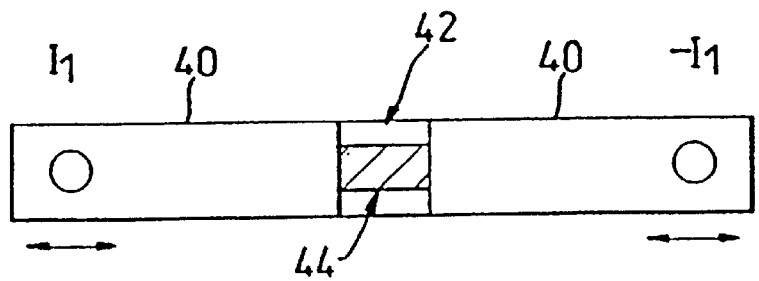
Figure 6:
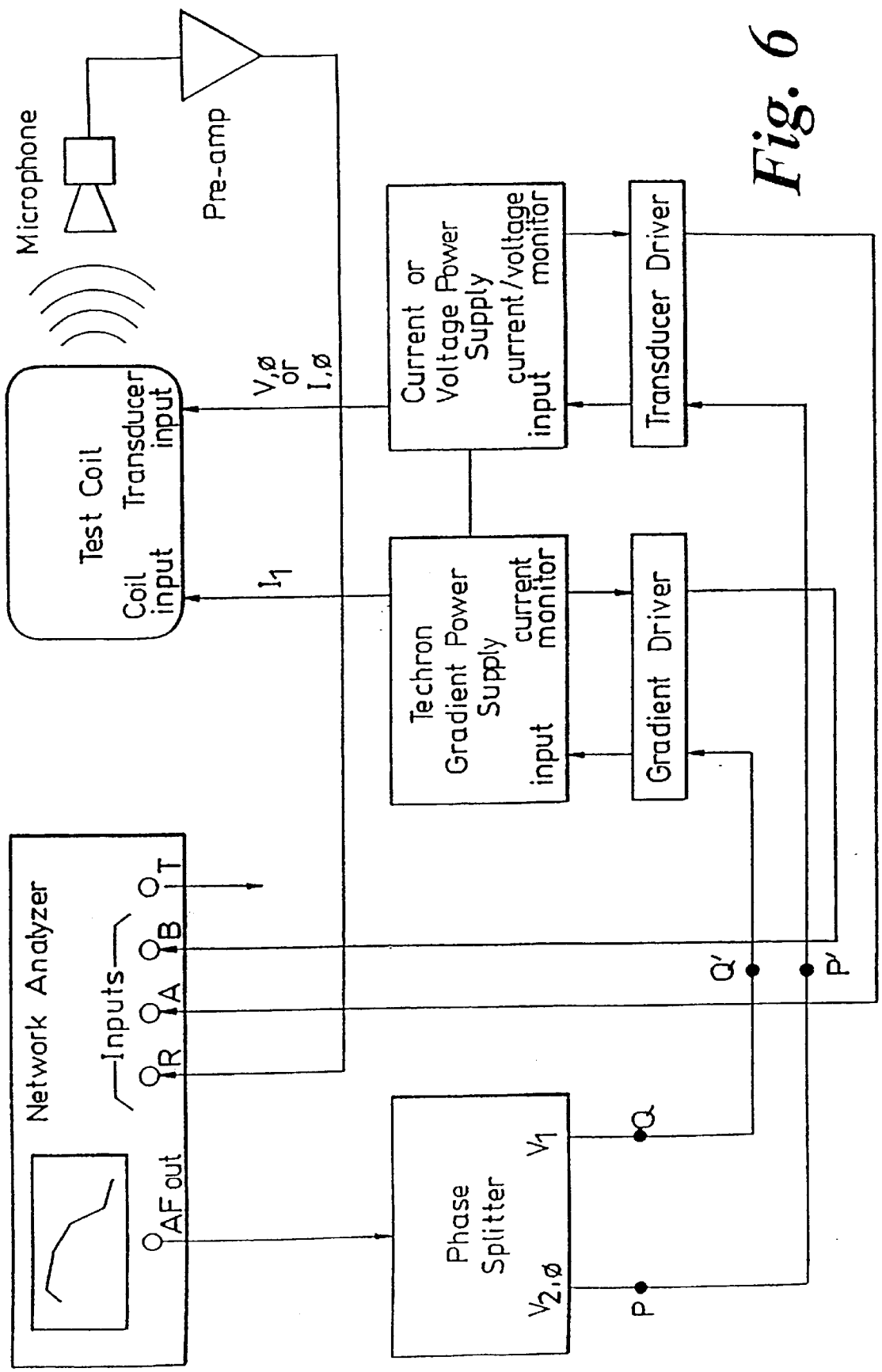

We take the ratio of long and short axes to be greater than 1 and preferably around 3:1 so that acoustic compressional waves induced along the long axis of the coils when supported in a suitable material may be ignored. We concentrate on the launch of plane compressional waves which traverse the short axis of the coil. It has been shown elsewhere (P. Mansfield, P. M. Glover and J. Beaumont, Sound Generation in Gradient Coil Structures for MRI. Magn. Reson. Med. (to be submitted)), that the simultaneous launch of waves from both sides of the supporting board creates a distortion of the board thickness causing a thickening or a thinning of the board depending on the direction of the Lorentz forces applied at the edges, and this thickening or thinning of the board generates an acoustic wave in air which travels normal to the board face along the direction of the static magnetic field. In order to cancel the transverse acoustic waves within the solid board 40 it is proposed that a slot 42 be cut down the centre of the board as indicated in FIG. 4 and in this slot is posted one or several piezoelectric devices 44,46, the surfaces of which make contact with thin metallic strips which are glued to the slot surface. The conducting strips provide electrical supply to activate the transducers. The arrangement is shown in plan view in FIG. 5. The arrows represent the movement of the board edges when the wire loop is energised within a magnetic field, B. Without the piezoelectric devices in place acoustic waves launched from each wire at the edges of the board will arrive with a phase delay which is related to the width of material traversed by the acoustic wave and the velocity of sound in the board material. Because the wires at the edges of the board carry equal and opposite currents there is an inherent 180° phase shift which, due to wave transit delays, is reduced slightly between the two waves when they arrive at each side of the slot. If now the piezoelectric devices are activated with the right phase shift and amplitude, the acoustic wave in the support material at the slot can be cancelled. For continuous sinusoidal or other harmonic modulation of the current in the gradient coil (P. Mansfield, P. R. Harvey and R. J. Coxon, Multi-mode resonance gradient coil circuit for ultra high speed NMR imaging. Meas. Sci. Technol. 2, 1051–1058 (1991)), the piezoelectric devices must be activated with a sinusoidal or other harmonically modulated voltage of appropriate amplitude and phase to cancel the acoustic wave. A gradient and transducer drive circuit is shown in FIG. 6. In this arrangement used here as a test rig a network analyser is used both to produce the basic AF output signal and to receive the audio response and monitor signals. This allows a swept frequency display of the acoustic output data. The AF output is fed to a phase splitter which produces two voltage outputs of independently variable amplitudes, $V_1$ and $V_2$, with a variable phase difference, $\phi$. Output $V_1$ is fed via a gradient driver amplifier to a current is amplifier the output, $I_1$ of which is fed directly to the gradient coil. The voltage output $V_2$ is fed via a transducer driver circuit to the voltage amplifier (in the case of a piezoelectric transducer) which output voltage, V with phase $\phi$, is fed directly to the transducers.

Monitor signals are fed from both power amplifiers back to the network analyser inputs A,B. The acoustic noise is picked up by the microphone and its signal returned to the R input. The network analyser can be used in a swept frequency mode or in a spot frequency mode.

Figure 7:
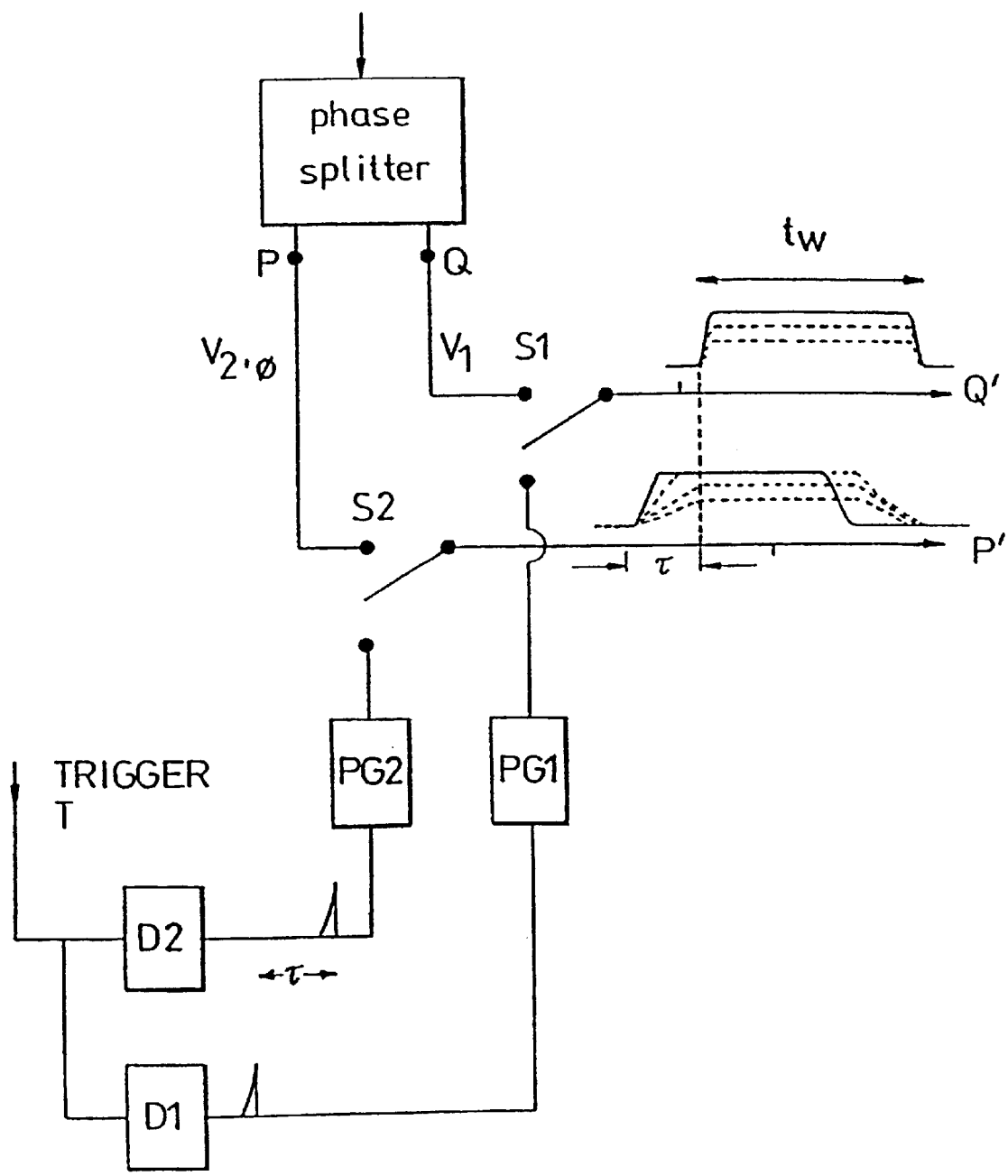

If the gradient coil current is activated in the form of a single pulse, then the piezoelectric devices must be similarly pulsed with appropriate amplitude and delay time in order to effectively cancel out the arriving waves at the slot. For pulses, the trigger output, T, of the network analyser is used to time events. For dispersive media the actual waveform shape arriving at the slot may have suffered distortion. In this case the waveform of the piezoelectric devices must be so shaped as to produce a matching waveform for perfect cancellation. A circuit arrangement for shaping and delaying the pulses is shown in FIG. 7 and is inserted in circuit between the points PQ and P'P' in the diagram of FIG. 6. The switches S1 and S2 are set appropriately to switch in the pulse generators PG1 and PG2 respectively. The pulse generators are triggered via delays D1 and D2 from the input T.

For non-test use the network analyser can be replaced by a waveform controller with appropriate generators. In this use, three gradient drivers, x, y and z, are required and at least three zonal transducer drivers.

Rectangular gradient coil units may be assembled to produce a transverse gradient as discussed above. The same principles can be applied to transverse gradients with cylindrical symmetry comprising a set of closed arc loops incorporating piezoelectric transducers. However, there is a slight complication when considering curved geometries as shown in FIG. 3. Acoustic transmission in the support medium is no longer by plane waves but by cylindrical waves. In essence this means that waves formed from a convex wire decrease in amplitude as they proceed into the solid medium, whereas waves formed from a concave wire will increase in amplitude as they progress into the medium.

Because of this feature, one matching method is to make the supporting structure for the gradient coil wire loop with two different materials, one supporting the convex acoustic wave and the second supporting the concave acoustic wave. These materials will in general have different compressional wave velocities and this in turn means in general that the slot between the two wires is no longer in the centre of the arrangement but displaced to a position such that the arriving convex and concave acoustic waves have equal and opposite amplitudes at the slot.

Figure 8:
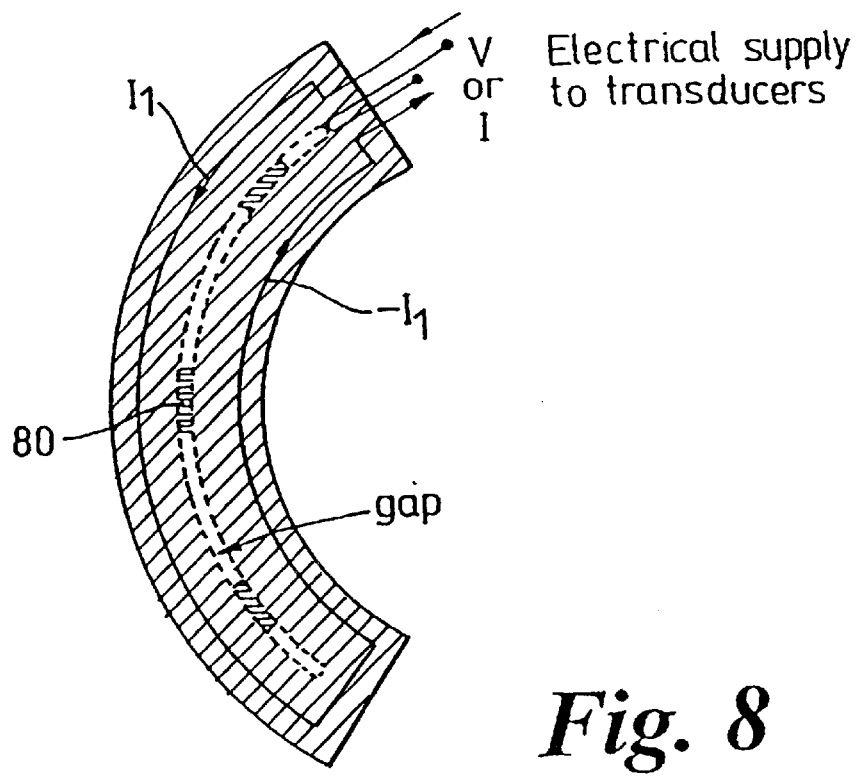
Figure 9:
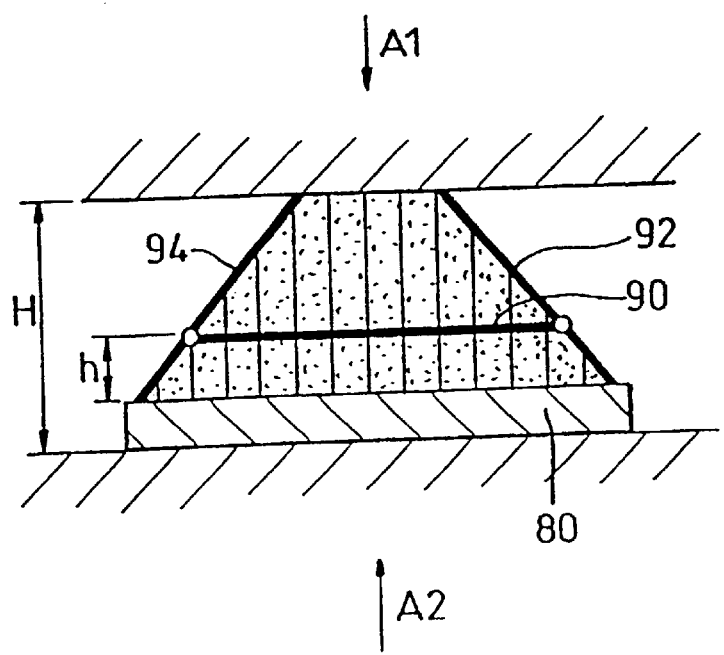

An alternative approach is to keep the slot in the middle of the board and match the acoustic amplitudes at the slot edges to the transducer 80 with a matching unit. The slot can be typically 2–3 mm. This is shown in FIG. 8. FIG. 9 shows one form of a mechanical matching arrangement and piezoelectric transducer mounted between the slot edges. This arrangement, shown end on, depicts three rigid plates 90,92, 94, two angled 92,94 and coupled by the third plate 90 which is hinged or pivoted between the first two plates. The space enclosed by the plates is filled with a flexible material and the material and overall dimensions of the matching unit are such that it is non-resonant in the frequency range used. By having the connecting plate 90 below the halfway point, i.e. h<H/2, vertical movements of the top and bottom of the matching unit will be different, thereby achieving the desired acoustic matching. Also shown in the diagram is the transducer 80 and the position of the whole arrangement which is sandwiched between the two surfaces with strip conductors.

We have discussed a specific low frequency matching device but other arrangements may be used as matching devices.

Figure 10:
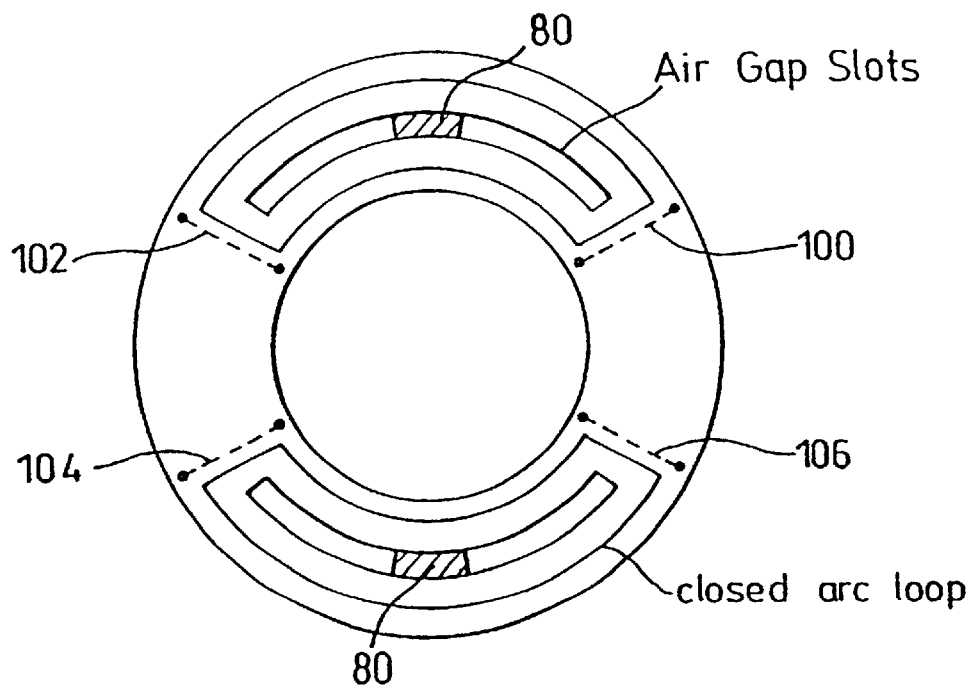

The arcuate segments can be mounted in pairs on boards as sketched in FIG. 10. In this case additional slots 100, 102, 104, 106 (dotted) may be introduced to prevent tangential acoustic transmission.

Figure 11:
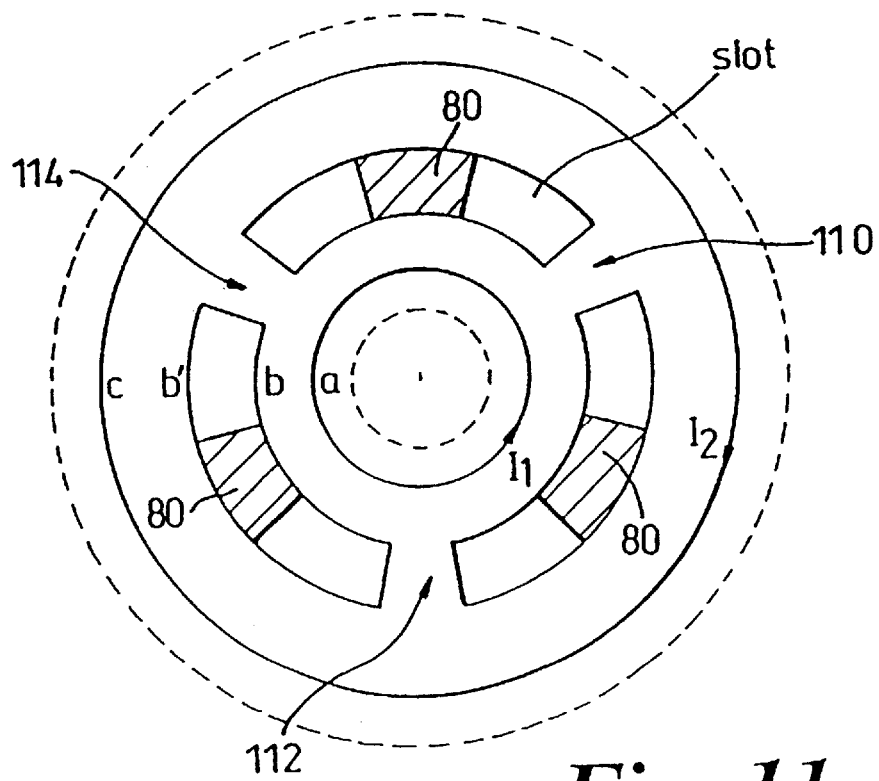
FIG. 11 shows a sketch showing the mounting arrangement for two circular hoops forming part of an axial gradient arrangement comprising two current hoops of radii a and c with currents $I_1$ and $I_2$ respectively.

The circular z gradient coils can also be made of pairs of hoops on a single board with a separating slot into which the matched transducers are deployed, FIG. 11. For acoustic cancellation the currents in the inner and outer hoops, $I_1$ and $I_2$, can be adjusted so that the acoustic amplitudes each side of the slot are equal and opposite. In this case transducers only can be deployed, matching arrangements being unnecessary in this case. To maintain the mechanical integrity of the board, several supporting segments 110, 112, 114 are left.

Figure 12:
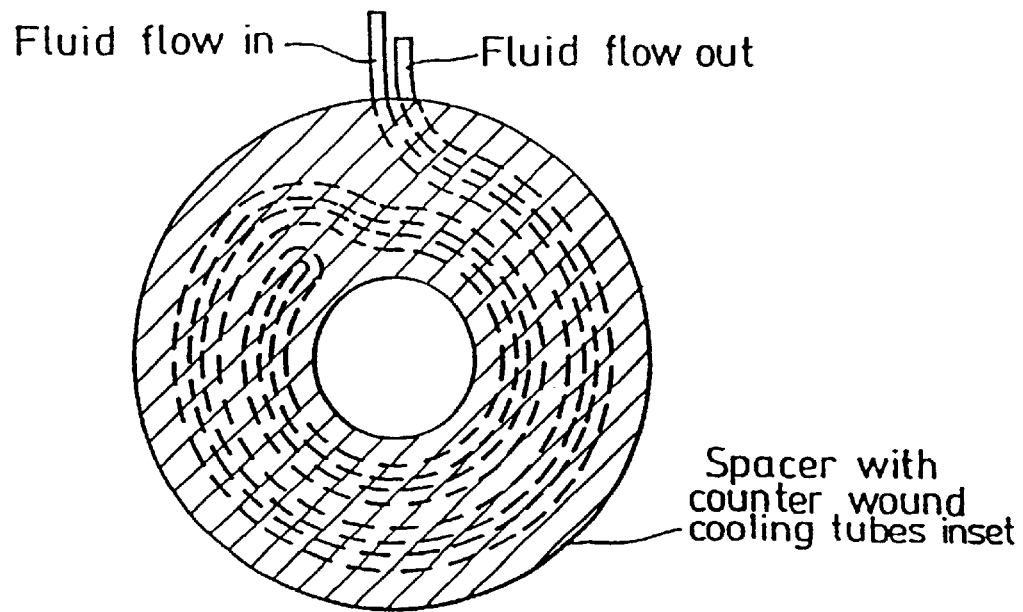
FIG. 12 shows a sketch of a fluid cooled spacer annulus.
Figure 13:
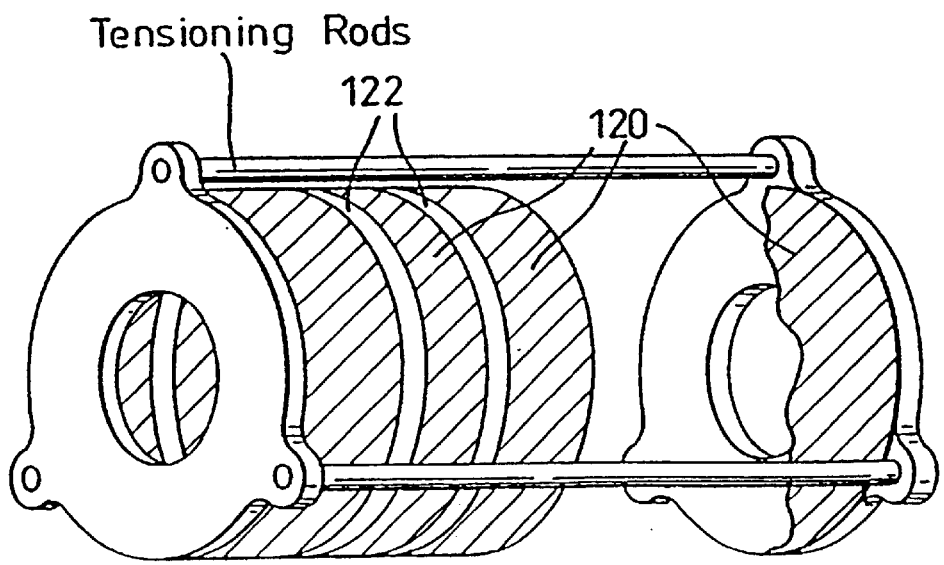
FIG. 13 shows a sketch of assembled gradient coil showing the gradient coil plates and spacers.

Both the transverse and axial gradient plates are spatially distributed by water/oil cooled spacer plates 120, FIG. 12. The whole assembly of gradient plates 122 and spacers is sketched in FIG. 13.

Transverse gradient coils based on closed loop geometries are, of course, not screened magnetically. If magnetic screening is required this can be implemented as an addition to the design. However, it is difficult to implement this extra magnetic screening with its own acoustic cancellation. Without acoustic cancellation there will be some acoustic output from the magnetic screen which would vitiate the acoustic cancellation efficacy of the overall coil assembly.

The most satisfactory way of producing magnetically screened coils is well known (P. Mansfield and B. Chapman, Active magnetic screening of gradient coils in NMR imaging. J. Mag. Res. 66, 573–576 (1986) and P. Mansfield and B. Chapman, Active magnetic screening of coils for static and time-dependent magnetic field generation for NMR imaging. J. Phys. E. 19, 540–545 (1986)) and involves two magnetic coils, one which we may call the primary and the second coil the magnetic screen. For transverse gradients with cylindrical geometry, both primary and screen coils are usually of the distributed or fingerprint design. Each coil is wound on its own cylindrical surface. The radii of the two coils are such as to leave a gap between the primary and the screen. This may be filled with a suitable plastic potting material so that the inner and outer coils are mechanically coupled. However, in this configuration since the magnetic screen coil uses in general a lower current than the primary coil, the arrangement described is not Lorentz force balanced. When the primary coil and screen are simultaneously activated with currents of opposite polarity, acoustic waves of different amplitude will be launched within the material between the coils. In general the primary coil will produce a much greater Lorentz force than that generated by the magnetic screen. Because we are now dealing with the generation of cylindrical waves in the space between the coils, the convex cylindrical wave will reduce in amplitude as it proceeds radially outwards, whereas the concave acoustic wave produced by the magnetic screen will increase its amplitude as it proceeds radially inwards. Where these two waves have equal and opposite amplitude will dictate the position of a cylindrical slot 140, FIG. 14. This forms an intrinsically matched pair of cylinders. In this arrangement the material 142 carrying the convex wave on an inner cylindrical annulus will in general be different to the material 144 carrying the concave wave on an outer cylindrical annulus, thereby producing different compressional wave velocities and different wave attenuation constants.

In the part sketch of FIG. 14, which gives a view looking along the cylindrical z axis, the primary coil 146 has a radius a and carries a current $I_1$. It is moulded into a cylindrical annulus 142 of thickness $x_1$ and outer radius b, and is made of material with acoustic compressional wave velocity $v_1$ and attenuation constant $\alpha_1$. The magnetic screen 148 has a radius c and carries a current $I_2$. It is moulded into a second cylindrical annulus 144 of thickness $x_2$ with inner radius b' and is made of material with acoustic compressional wave velocity $v_2$ and attenuation constant $\alpha_2$. The slot 140 position and hence acoustic matching efficacy, will in general depend on all the variables mentioned as well as the details of the primary and magnetic screen coils.

A series of piezoelectric transducers 141, 143 are posted in the slot 140 between the two cylinders, as shown in exploded view of FIG. 15, and the metallic voltage supply strips 150 glued in position. The circuits of FIGS. 6 and 7 can then be used to activate both the magnetic coils and the piezoelectric transducers 141, 143 etc in order to cancel the acoustic wave within the solid cylinders. This arrangement does not affect the generation of the magnetic gradient or the efficacy of its magnetic screening since the current supplying the transducers is negligible and the small field generated from this current is entirely ignored.

An alternative matching arrangement is one where the slot is halfway between the primary and screen coils. The difference in magnitude of the amplitudes of the arriving acoustic waves is accommodated by using transducers with mechanical matching arrangements as indicated in FIGS. 8 and 9 or otherwise. This has the advantage that both inner and outer cylinders 142, 144 can be made of the same material.

In a working gradient set three gradient coils are required to produce three gradients along the three axes x, y and z. In the distributed coil arrangement of FIGS. 14 and 15 all three gradients would be magnetically screened and the primaries would, so far as is possible, all lie on the inner cylindrical surface of radius a, and the magnetic screens would all lie, as far as possible, on the cylindrical surface of radius c. The transducers for all three axes would be distributed in the same slot lying between radii b and b'. The extent of the transducer array is such that there will be some overlap between all three gradient axes and, therefore, we propose that the transducer array be divided into zones.

Figure 16A:
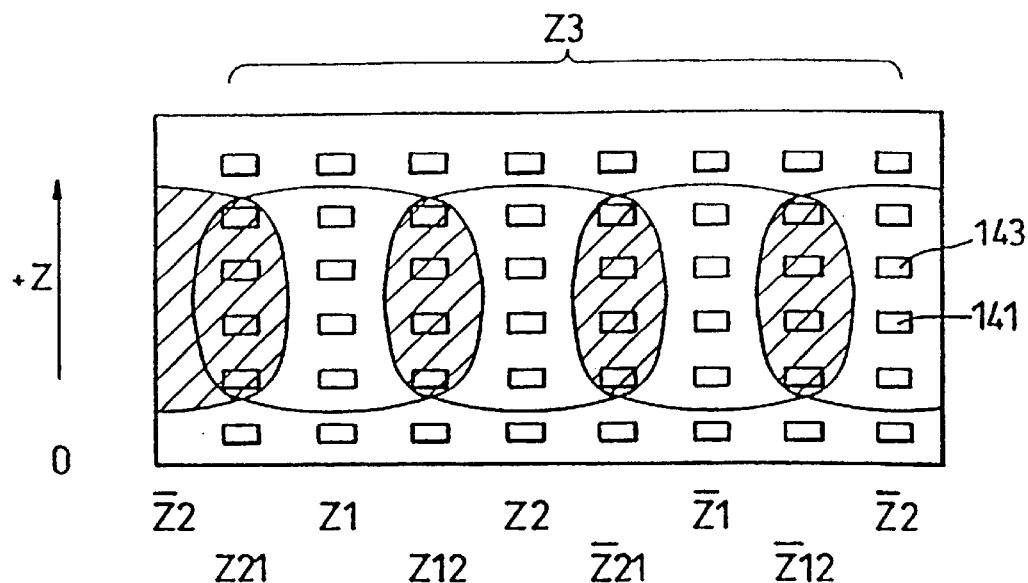
Figure 17:
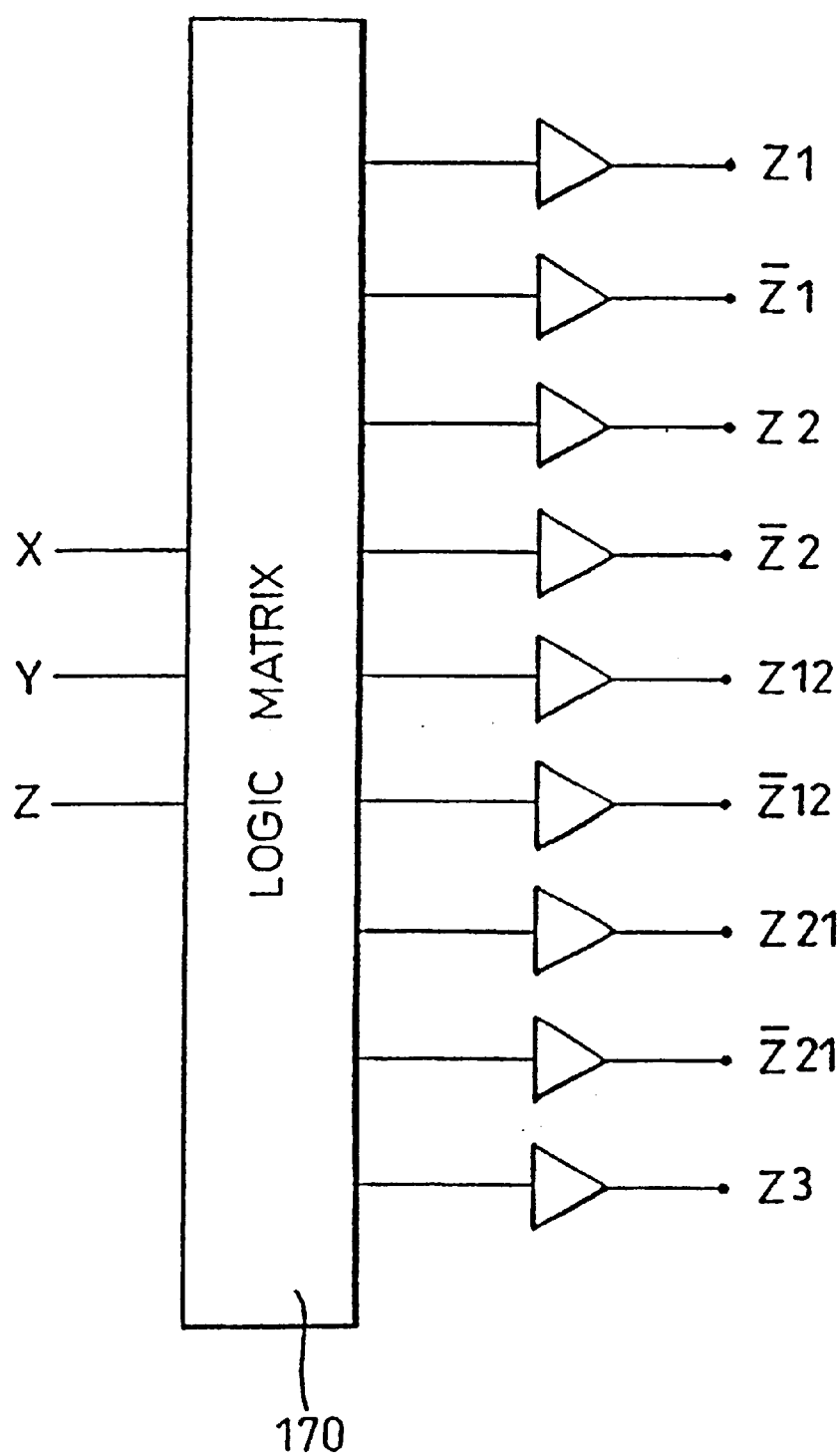

One such arrangement is shown in FIG. 16a in which the transducers are uniformly distributed around the cylindrical surface, here shown unrolled on to a plane sheet. Only the positive half-plane is shown in which the vertical axis is +z and the horizontal axis is b$\zeta$. In this arrangement depicted diagrammatically as a regular array of transducers with matching units, we have nine zones; Z1,$\overline{Z}$1 corresponding to the x axis, Z2,$\overline{Z}$2 corresponding to the y axis and Z3 corresponding to the z-axis. The shaded overlapping zones are designated Z21, $\overline{Z}$21, Z12 and $\overline{Z}$21. For a full gradient set including the −z half-plane, a further nine zones would be required corresponding to states complementary to those of the +z half-plane.

In a practical arrangement the transducers 141, 143 etc would be fixed to a thin flexible sheet 160 with drive strip line conductors 150 etc appropriately coupled to the various zones. The whole sheet would be rolled into a thin annular cylinder as shown in FIG. 16b with a second thin flexible sheet 162 supporting the inner surfaces of the transducers.

Figure 16B:
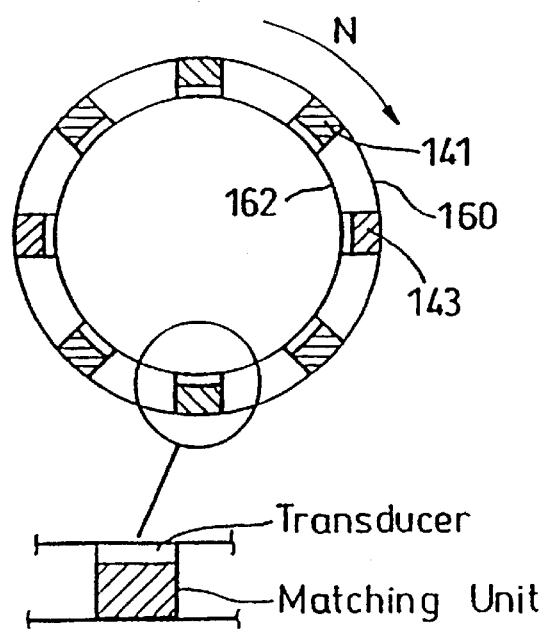

The inset diagram in FIG. 16b shows the arrangement of a matching unit 90, 92, 94 and transducer 80 (see FIG. 9) sandwiched between the two thin flexible cylinders 160, 162.

Figure 16C:
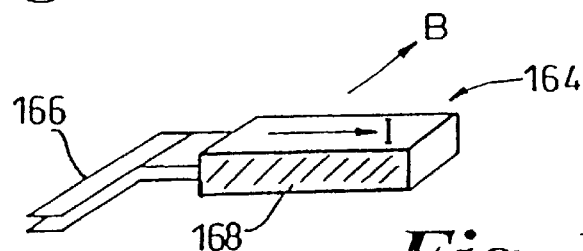

In FIG. 16c an alternative current transducer arrangement 164 is sketched. This comprises a strip conductor 166 sandwiching a stiff rubber spacer 168 and fed with a strip line conductor. Current I passes in the rectangular loop around the stiff rubber conductor and the plane of the loop is arranged to be normal to the magnetic field direction. Provided that the mechanical response of the rubber spacer is resonant well above the operating frequency, this transducer could be used instead of the piezoelectric devices referred to previously.

Because some of the zones in FIG. 16a are common to two or more axes, the zoning arrangement described above can be used to advantage by driving the nine transducer drivers, one for each zone via a logic decoder matrix 170 as shown in FIG. 17. This would be activated for an x, y or z input. According to the truth table, Table 1, using necessary directional logic. Additional zone drivers and decoding logic would be required to drive the transducers in the −z half-plane.

|   | Z1 | $\overline{Z}$1 | Z2 | $\overline{Z}$2 | Z3 | $\overline{Z}$21 | Z12 | Z21 | $\overline{Z}$12 |
|---|----|----|----|----|----|-----|-----|-----|-----|
| X | + | − | 0 | 0 | 0 | − | + | + | − |
| Y | 0 | 0 | + | − | 0 | + | + | − | − |
| Z | + | + | + | + | + | + | + | + | + |

Truth table relating the gradient direction (x,y,z) to the nine zone transducer amplifier states. The symbols + and − refer to the polarity of the output amplifiers and 0 means zero output.

Several transverse gradient coil arrangements for use in MRI have been described based on either rectangular closed current loops or closed arcuate current loops.

By introducing an appropriately placed slot forming an air gap in the rectangular or arcuate segments of the mounting board, transducers may be introduced and, when activated by an external voltage or current supply fed by strip conductors, can be made to cancel the acoustic wave which is generated by the Lorentz forces in the current loop. Similar arrangements may be made to cancel acoustic noise generated in circular hoop pairs, a distribution of which may be used to generate an axial field gradient.

For arcuate geometries an acoustic matching arrangement is required since the waves generated within the mounting board are no longer plane waves. One possibility discussed is for two distinctly different materials to be used either side of the slot, the characteristics of the materials being chosen to give an acoustic match. In this case the transducers can be posted directly into the slot. If the same material is used either side of the slot, then an acoustic matching device is required.

None of the gradient arrangements discussed immediately above incorporate magnetic screening. Magnetic screening can be introduced in the above described arrangements based on closed current loops, but the magnetic screen would not have acoustic cancellation.

For a fully magnetically screened system we propose an integrated strategy based on distributed transverse gradients of the fingerprint design and distributed z gradients. In this approach the primary and magnetic screen coils are designed in the standard way, but each is mounted on its own annular cylinder, the two cylinders being coaxial and separated by a small air gap. Transducers are appropriately placed in this gap making contact with the surfaces of the two cylinders. The material of the cylinders may be chosen to be different in order to achieve acoustic matching, in which case the transducers may be sandwiched directly between the cylinders with appropriate strip conductors to supply them with voltage. Alternatively, the cylinders may be made of the same material in which case acoustic matching is achieved by a matching unit which is inserted together with the transducer. In either case acoustic cancellation is possible without compromising in any way the magnetic characteristics of the gradient coil.

In the above embodiments we have described a single slot arrangement by way of example in which the transducers are posted. In a further embodiment of the single slot arrangement, a plurality of transducers are posted in the slot and are driven by a plurality of different amplitudes and different phases. For greater acoustic attenuation efficacy, a plurality of slots may be used which, for cylindrical coil geometries would be placed at different radii and for rectangular geometries would be distributed throughout the supporting blocks. Each slot will be driven by its own driver arrangement requiring a current or voltage drive to a plurality of transducers with independently adjustable phase and amplitude.

Single or multiple slots can also be used to improve the acoustic attenuation efficiency in combination with the re-entrant loop arrangement as described in our co-pending Application No. GB96/00734. In general, each slot would incorporate a plurality of re-entrant loops. Each re-entrant loop will be driven by its own current drive with independently adjustable phase and amplitude.

Ideally, for the case where multiple transducers or multiple re-entrant loops are used, the supporting plate would comprise at least two layers uncoupled except at the edges. Such an arrangement would allow independent acoustic wave transmission within the independent layers of supporting material. An object of this arrangement would be to create vibrational nodes at the plate edges, thereby preventing the plate from moving at the edges.

What is claimed is:

1. Apparatus for active acoustic screening of a coil system, said coil system comprising at least one current carrying conductor,
   the coil system being suitably mounted either between two blocks of acoustic material, the blocks being separated by a gap or within a slot in one block of acoustic material,
   characterised in that an active electromechanical transducer is mounted in said gap or slot in order to balance the active and reactive forces produced by the transducer and including means for energising the electromechanical transducer to oppose the vibratory noise generated by said coil system when energised in a static magnetic field.

2. An active acoustically controlled magnetic coil system comprising at least one current carrying conductor configured in a loop to provide outward and return paths and being mounted in support blocks of material having predetermined acoustic transmission characteristics, said support blocks comprising first and second portions separated by a gap said outward and return paths being mounted respectively in said first and second portions and further including at least one active transducer mounted in said gap, and comprising means for supplying a predetermined alternating current to said conductor and energisation means for supplying the at least one active transducer with selected energisation and selected phase with respect to the said alternating current, said energisation being selected to generate mechanical movement in said transducer to actively oppose vibrations created in said support block by said conductor to reduce the acoustic noise generated by the coil system when energised in a static magnetic field.

3. An acoustically controlled magnetic coil system as claimed in claim 2 in which there are provided a plurality of transducers, each being provided with energisation to create mechanical movement within the transducer to reduce the noise generated by the coil system.

4. An acoustically controlled magnetic coil system as claimed in claim 3 in which a means for determining the selected energisation supplied to the transducers comprises a microphone mounted to receive noise signals generated by the at least one current carrying conductor, said microphone being connected to a display means and including a control circuit supplying relative phase and amplitude control signals to said energisation means to energise the transducers to reduce the noise generated by the coil system.

5. An accountically controlled magnetic coil system as claimed in claim 2 in which the active transducer comprises a piezoelectric transducer, the piezoelectric material of which may be a quartz crystal, barium titanate, lead zirconium titanate or other such piezoelectric materials.

6. An acoustically controlled magnetic coil system as claimed in claim 2 in which the active transducers may comprise magneto strictive devices of a size small enough so as not to significantly affect the required gradient field.

7. An acoustically controlled magnetic coil system as claimed in claim 2 in which the active transducer comprises a thin current loop enclosing a rubber block, its dimensions chosen so as to make the device non-resonant at the operating frequency.

8. An acoustically controlled magnetic coil system as claimed in claim 7 in which the first and second portions of the support block comprise the same material and the position of the gap is equidistant between the outward and return paths.

9. An acoustically controlled magnetic coil system as claimed in claim 7 in which the first and second portions of the support block comprise different materials having different acoustic compressional wave velocities and different attenuation constants, the position of the gap then being selectable to be non-equidistant between the outward and return paths of said current carrying conductor.

10. An acoustically controlled magnetic coil system as claimed in claim 7 in which the transducer is provided with a matching unit to enable it to produce different mechanical movements on each side of the gap.

11. An acoustically controlled magnetic coil system as claimed in claim 2 in which the outward and return paths comprise separate conductors with separate drive means forming a coil system comprising a primary coil and a magnetic screening coil for said coil system, the transducer means being energised to reduce the acoustic output of the coil system.

12. An acoustically controlled magnetic coil system as claimed in claim 11 in which the conductors for each primary coil are arranged in arcs.

13. An acoustically controlled magnetic coil system as claimed in claim 2 in which the coil system comprises x, y and z gradient coils and screening coils for said x, y and z gradient coils and in which the transducers are mounted between said coils and said screening coils and energised to reduce the acoustic output of the system.

14. An acoustically controlled magnetic coil system as claimed in claim 13 in which the transducers are spatially distributed with common zones used to cancel the acoustic wave for the x,y and z gradient coils and a logic matrix drive system used to selectively energise a plurality of drive units for the transducers, those transducers within any common zone area being driven at an amplitude and phase which may be different to those in non-common zones.

15. An acoustically controlled magnetic coil system as claimed in claim 13 in which the conductors for each primary coil and magnetic screening coil and the acoustic control transducers are each distributed on individual cylindrical geometries, each of the aforesaid coils being arranged in the form of a fingerprint coil, each cylinder being arranged in a nested concentric and coaxial set.

16. An acoustically controlled magnetic coil system as claimed in claim 13 in which the coils form a gradient coil system for an MRI apparatus.

* * * * *